(12) United States Patent
Hu

(10) Patent No.: US 6,900,119 B2
(45) Date of Patent: May 31, 2005

(54) AGGLOMERATION CONTROL USING EARLY TRANSITION METAL ALLOYS

(75) Inventor: Yonjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 280 days.

(21) Appl. No.: 09/896,093

(22) Filed: Jun. 28, 2001

(65) Prior Publication Data

US 2003/0001266 A1 Jan. 2, 2003

(51) Int. Cl.⁷ .......................................... H01L 21/4763
(52) U.S. Cl. ..................................... 438/627; 438/643
(58) Field of Search ................................ 438/627, 628, 438/643

(56) References Cited

U.S. PATENT DOCUMENTS

| | | | |
|---|---|---|---|
| 4,441,964 A | | 4/1984 | Mikkers et al. |
| 4,985,750 A | | 1/1991 | Hoshino |
| 5,118,661 A | | 6/1992 | Maeda |
| 5,310,602 A | * | 5/1994 | Li et al. ...................... 428/432 |
| 5,391,517 A | * | 2/1995 | Gelatos et al. ............... 438/643 |
| 5,744,394 A | | 4/1998 | Iguchi et al. |
| 5,786,269 A | | 7/1998 | Murakami et al. |
| 5,980,977 A | | 11/1999 | Deng et al. |
| 5,990,011 A | | 11/1999 | McTeer |
| 6,001,461 A | | 12/1999 | Toyoda et al. |
| 6,084,302 A | | 7/2000 | Sandhu |
| 6,126,989 A | | 10/2000 | Robinson et al. |
| 6,133,139 A | | 10/2000 | Dalal et al. |
| 6,165,555 A | | 12/2000 | Jun et al. |
| 6,194,108 B1 | | 2/2001 | Akutsu et al. |
| 6,194,315 B1 | | 2/2001 | Hu et al. |
| 6,258,710 B1 | * | 7/2001 | Rathore et al. ............. 438/628 |
| 6,376,370 B1 | * | 4/2002 | Farrar ......................... 438/678 |
| 6,417,566 B1 | * | 7/2002 | Wang et al. ................. 257/750 |

FOREIGN PATENT DOCUMENTS

| | | | |
|---|---|---|---|
| JP | 11-330001 | * | 11/1999 |
| JP | 2000-124310 | * | 4/2000 ......... H01L/21/768 |

OTHER PUBLICATIONS

Wang et al., "Binary Cu–alloy layers for Cu–interconnections reliabilty improvement" IEEE International Proceedings on Interconnect Technology Conference, Jun. 4–6, 2001, pp 86–88.*

Nogami et al., "Characterization of the Cu/Barrier Metal Interface for Copper interconnects", IEEE International Proceedings on Interconnect Technology Conference, Jun. 1–3, 1998, pp 298–300.*

De Boer et al., "Cohesion in Metals: Transition Metal Alloys", 1988, Amsterdam, North Holland–Elsevier Science, pp. preface–101, 105–142, 339–381,495–535.

Subramanian et al., "Binary Alloy Phase Diagrams", 1990, vol. I, pp. 51–52, 88, 90, 113, 115, 1416, 1418–1419, 1428–1429, 1494–1496, 1473–1475, 1505–1506, 1511–1513.

* cited by examiner

*Primary Examiner*—W. David Coleman
(74) *Attorney, Agent, or Firm*—Leffert Jay & Polglaze, P.A.

(57) ABSTRACT

Structures and methods of fabricating portions of integrated circuit devices to reduce agglomeration tendencies of high surface-energy metals used in interconnects and contacts. Early transition metals having relatively low surface energies are chosen to form stable crystalline compounds rich in the high surface-energy metal. Agglomeration control layers containing such alloy compounds facilitate adhesion between the high surface-energy metal and an underlying layer of the integrated circuit device, such as a diffusion barrier layer. These agglomeration control layers may be nitrided to improve robustness at higher temperatures.

64 Claims, 4 Drawing Sheets

AGGLOMERATION CONTROL USING EARLY TRANSITION METAL ALLOYS

TECHNICAL FIELD OF THE INVENTION

The present invention relates generally to fabrication of integrated circuit devices, and in particular to the use of early transition metal alloys and their nitrides to reduce the agglomeration tendencies of metals used to form interconnects and other conductors within an integrated circuit device.

BACKGROUND OF THE INVENTION

In the fabrication of a semiconductor integrated circuit device, it is desirable to fabricate the device with materials having a low resistivity (i.e., property of resistance to current flow) in order to optimize the device's electrical performance. Lower resistance within the device allows faster processing of information due to a smaller delay time associated with resistance to current flow.

Various portions of an integrated circuit device are typically interconnected using metal lines (i.e., conductive layers) with metal contacts extending to active areas within the device. Resistivity of the metal lines plays an increasingly important role in the overall resistance of an integrated circuit device. As such devices become more dense, wiring length increases. Furthermore, wiring pitch decreases, which effectively decreases the available wiring width. As the wiring width decreases, resistivity of the wiring material becomes a dominant factor as compared to parasitic capacitance between wires (i.e., that associated with device resistance). Thus, it is desirable to decrease the resistivity of wiring material within an integrated circuit device.

Copper (Cu) and silver (Ag) are becoming increasingly desirable in integrated circuit fabrication as a replacement for aluminum (Al), particularly for interconnect lines and other conductive structures (i.e., conductive digit lines and plugs connecting the conductive layers). Copper and silver have lower resistivity and higher resistance to electromigration (i.e., the transport of metal atoms in conductors carrying large current densities, resulting in morphological degradation of the conductors) than aluminum.

These metal interconnects and contacts are typically formed using a dual damascene technique. In a dual damascene process, a dielectric layer is formed over a semiconductor substrate in which the integrated circuit device is being fabricated. Vias are formed in the dielectric layer to expose active areas of the semiconductor substrate and trenches are formed in the dielectric layer to couple the vias to other portions of the integrated circuit device. A metal layer is then blanket deposited to fill the trenches and vias and to cover the dielectric layer. The excess metal overlying the dielectric layer is removed, such as by chemical-mechanical planarization (CMP) to define the metal interconnects as the metal-filled trenches and metal contacts as the metal-filled vias. A CMP process generally involves abrading the surface of the semiconductor substrate with an abrasive and a solution to chemically assist the abrasive. The abrasive/solution combination is generally specific to the material to be removed and to the surrounding materials to be retained.

To reduce migration or diffusion of copper or silver into the underlying substrate, a diffusion barrier layer is often interposed between the substrate and the metal layer. Tantalum nitride is one material used as a diffusion barrier layer between the substrate and the metal layer. Continuous copper and silver layers are readily formed over tantalum nitride. However, it is generally necessary to use two different abrasive/solution combinations to first remove the copper or silver layer and then remove the tantalum nitride layer. While the use of titanium nitride as a diffusion barrier layer facilitates the use of a single abrasive/solution combination, it can be difficult to form copper or silver layers on a titanium nitride layer. Because of their large surface energies, copper and silver tend to agglomerate on a titanium nitride layer, thus tending to result in a discontinuous film and the production of voids in the damascene structure.

For the reasons stated above, and for other reasons stated below that will become apparent to those skilled in the art upon reading and understanding the present specification, there is a need in the art for alternative structures and methods for utilizing copper, silver and other high surface-energy metals as integrated circuit interconnect materials.

SUMMARY

Structures and methods of fabricating portions of integrated circuit devices are described to reduce agglomeration tendencies of high surface-energy metals used in interconnects and contacts. Early transition metals having relatively low surface energies are chosen to form stable crystalline compounds rich in the high surface-energy metal. Agglomeration control layers containing such alloy compounds facilitate adhesion between the high surface-energy metal and an underlying layer of the integrated circuit device, such as a diffusion barrier layer. These agglomeration control layers may be nitrided to improve robustness at higher temperatures.

For one embodiment, the invention provides a method of forming a metal interconnect in an integrated circuit device. The method includes forming a diffusion barrier layer on a substrate and forming a first metal layer on the diffusion barrier layer. The first metal layer contains a first metal component and a second metal component forming a crystalline compound with the first metal component. The second metal component has a surface energy lower than a surface energy of the first metal component and the crystalline compound is rich in the first metal component. The method further includes forming a second metal layer on the first metal layer, wherein the second metal layer contains the first metal component. Excess portions of the second metal layer are removed to define the metal interconnect.

For another embodiment, the invention provides a method of forming a portion of an integrated circuit device. The method includes forming a layer of titanium nitride and forming a first metal layer on the layer of titanium nitride. The first metal layer contains a copper-rich alloy containing scandium, yttrium, lanthanum, titanium, zirconium or hafnium. Some examples include $Cu_4Sc$, $Cu_6Y$, $Cu_4Ti$, $Cu_3Ti$ or $Cu_5Zr$. The method further includes forming a second metal layer on the first metal layer, wherein the second metal layer contains copper.

For yet another embodiment, the invention provides a method of forming a portion of an integrated circuit device. The method includes forming a layer of titanium nitride and forming a first metal layer on the layer of titanium nitride. The first metal layer contains a silver-rich alloy containing scandium, yttrium or lanthanum. Some examples include $Ag_4Sc$ or $Ag_4Y$. The method further includes forming a second metal layer on the first metal layer, wherein the second metal layer contains silver.

For a further embodiment, the invention provides a method of forming a metal interconnect in an integrated circuit device. The method includes forming a diffusion barrier layer on a substrate and forming a nitrided metal layer on the diffusion barrier layer. The nitrided metal layer contains a first metal component, a second metal component capable of forming a crystalline compound with the first metal component, and nitrogen. The second metal component has a surface energy lower than a surface energy of the first metal component and the nitrided metal layer is rich in the first metal component. The method further includes forming a second metal layer on the nitrided metal layer, wherein the second metal layer contains the first metal component. Excess portions of the second metal layer are removed to define the metal interconnect.

For a still further embodiment, the invention provides a method of forming a portion of an integrated circuit device. The method includes forming a layer of titanium nitride and forming a nitrided metal layer on the layer of titanium nitride. The nitrided metal layer is of the form $MT_xN_y$, where M is a first metal component, T is a Group IIIA or Group IVA transition metal, N is nitrogen, x is an atomic fraction of T, y is an atomic fraction of N, and x and y are each less than one. The method further includes forming a metal layer on the nitrided metal layer, wherein the metal layer contains the first metal component.

For one embodiment, the invention provides a portion of an integrated circuit device. The portion includes a diffusion barrier layer and a first metal layer on the diffusion barrier layer. The first metal layer contains a crystalline alloy compound containing a first metal component and a second metal component, wherein the second metal component is selected from the group consisting of Group IIIA and Group IVA elements. An atomic ratio of the first metal component to the second metal component in the first metal layer is greater than one. The portion further includes a second metal layer on the first metal layer, wherein the second metal layer contains the first metal component. The diffusion barrier layer may be a titanium-containing material such as titanium nitride.

For another embodiment, the invention provides a portion of an integrated circuit device. The portion includes a diffusion barrier layer and a nitrided metal layer on the diffusion barrier layer. The nitrided metal layer contains a first metal component, a second metal component and nitrogen. The second metal component is selected from the group consisting of Group IIIA and Group IVA elements. An atomic ratio of the first metal component to the second metal component in the nitrided metal layer is greater than one. The portion further includes a second metal layer on the first metal layer, wherein the second metal layer contains the first metal component. The diffusion barrier layer may be a titanium-containing material such as titanium nitride.

For yet another embodiment, the invention provides a portion of an integrated circuit device. The portion includes a titanium nitride layer and a nitrided metal layer on the titanium nitride layer. The nitrided metal layer contains copper, a metal component capable of forming a crystalline compound with the copper, and nitrogen. The metal component is selected from the group consisting of scandium, yttrium, lanthanum, titanium, zirconium and hafnium. An atomic ratio of copper to the metal component in the nitrided metal layer is greater than one. The portion further includes a layer of metal on the nitrided metal layer, wherein the layer of metal contains copper.

For still another embodiment, the invention provides a portion of an integrated circuit device. The portion includes a titanium nitride layer and a nitrided metal layer on the titanium nitride layer. The nitrided metal layer contains silver, a metal component capable of forming a crystalline compound with the silver, and nitrogen. The metal component is selected from the group consisting of scandium, yttrium and lanthanum. An atomic ratio of silver to the metal component in the nitrided metal layer is greater than one. The portion further includes a layer of metal on the nitrided metal layer, wherein the layer of metal contains silver.

Further embodiments of the invention include apparatus and methods of varying scope.

DETAILED DESCRIPTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description include any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and the terms wafer and substrate include the underlying layers containing such regions/junctions. The following detailed description is, therefore, not to be taken in a limiting sense, and the scope of the present invention is defined only by the appended claims and equivalents thereof.

Figure 1A:
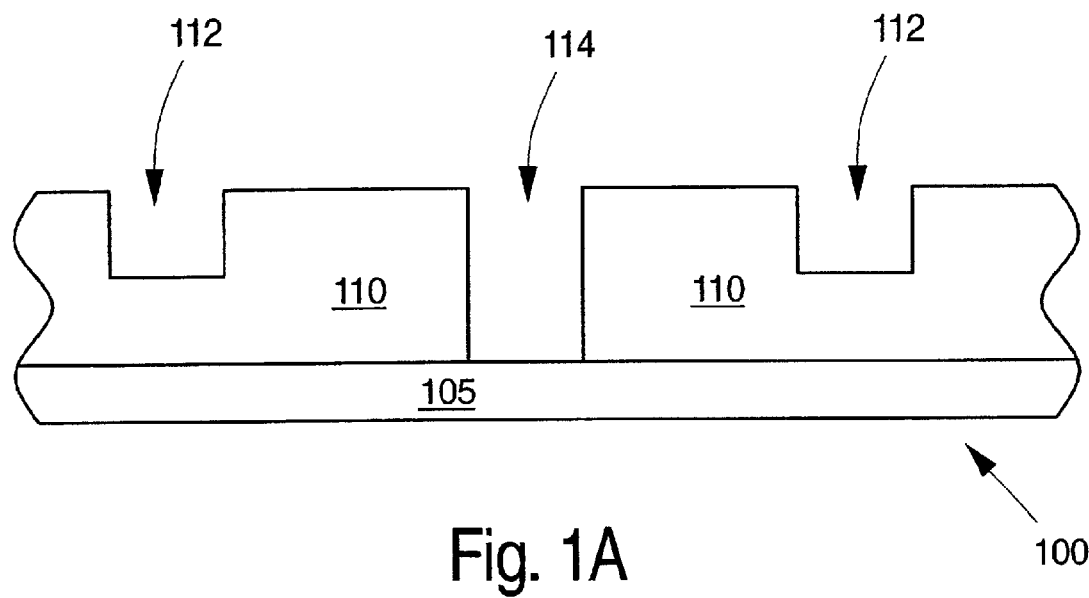
FIGS. 1A–1F are cross-sectional views of a portion of an integrated circuit device at various stages of fabrication in accordance with one embodiment of the invention.

FIGS. 1A–1F are cross-sectional views of a portion of an integrated circuit device 100 at various stages of fabrication. In FIG. 1A, a dielectric layer 110 is formed on a base layer 105. For one embodiment, the base layer 105 is a semiconductor substrate, such as a monocrystalline silicon substrate. Other semiconductor substrates are known and used in the art of semiconductor fabrication. For additional embodiments, the base layer 105 may be conductor layer. For example, the base layer 105 may be a metal line or other conductive interconnect, such as a Metal 1 layer, Metal 2 layer, Metal 3 layer, etc.

Dielectric layer 110 contains an insulator or dielectric material, such as a silicon oxide ($SiO/SiO_2$), silicon nitride ($SiN/Si_2N/Si_3N_4$) or silicon oxynitride ($SiO_xN_y$) material. For one embodiment, the dielectric layer 110 contains a doped silicon oxide material, such as borophosphosilicate glass (BPSG), a boron- and phosphorous-doped silicon dioxide material. Other dielectric materials are known and used in the art of semiconductor fabrication.

The dielectric layer 110 is patterned to define recesses or apertures such as trenches 112 and vias 114 as depicted in FIG. 1A. Patterning of the dielectric layer 110 may include conventional photolithographic techniques to mask portions of the dielectric layer 110 and to expose portions of the dielectric layer 110 where future trenches 112 and vias 114 are to be formed. The exposed portions of the dielectric layer 110 are then removed. The portions of the dielectric layer 110 may be removed by etching or other suitable removal technique known in the art. Removal techniques are generally dependent upon the material of construction of the layer to be removed as well as the surrounding or underlying layers to be retained.

Due to the nature of the dual damascene process, the depth of the etch is variable across the surface of the device 100, e.g., the etch depth is greater where vias 114 are defined and less where only trenches 112 are defined. Thus, two mask and etch steps can be utilized in a conventional photolithographic process to define the vias 114 separately from the trenches 112. Alternatively, a gray mask pattern can be utilized to define the vias 114 and trenches 112 simultaneously in one photolithographic mask and etch step. The trenches 112 will form interconnect lines for the integrated circuit device while the vias 114 will form contacts to active areas of the integrated circuit.

Figure 1B:
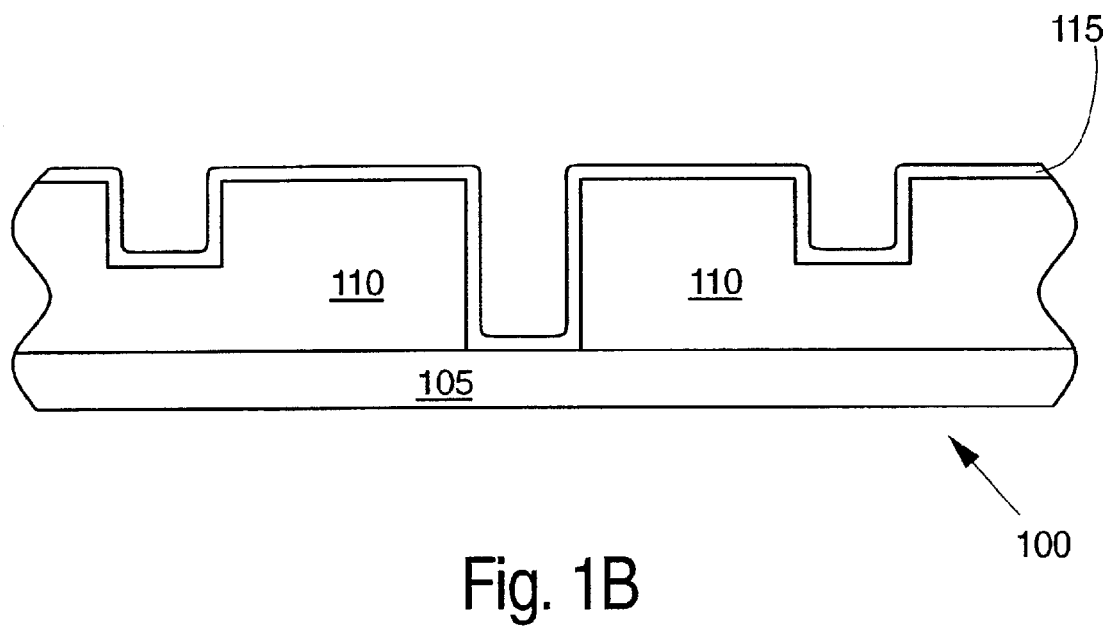
Figure 1C:
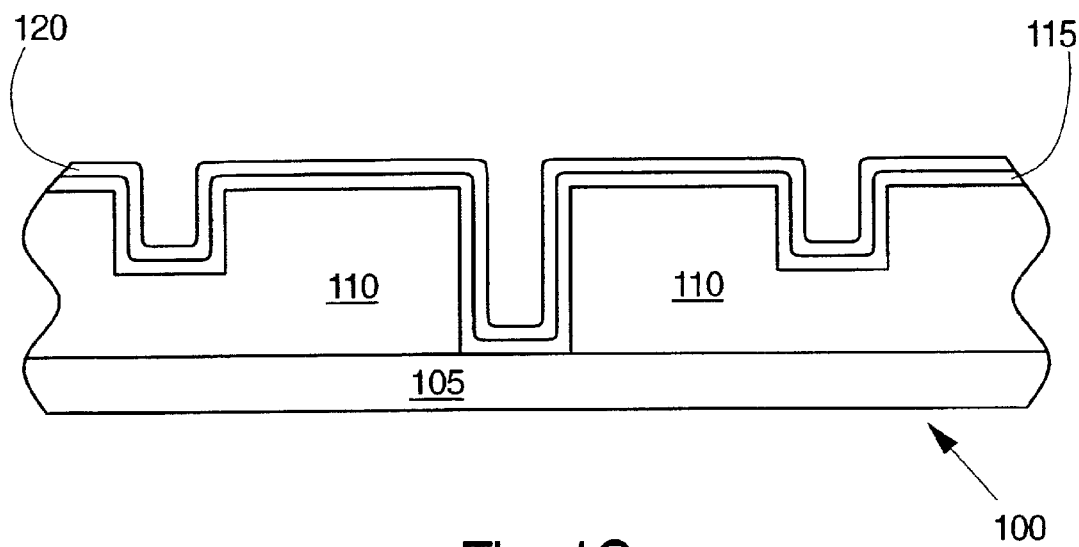

Following patterning of the dielectric layer 110, a diffusion barrier layer 115 is formed overlying the dielectric layer 110 and the exposed portions of the base layer 105 in FIG. 1B. The diffusion barrier layer 115 preferably covers the sidewalls and bottoms of the trenches 112 and vias 114 as well as the surface of the dielectric layer 110. Portions of the diffusion barrier layer 115 covering bottoms of the vias 114 are in contact with the underlying base layer 105, which may be an active area of a semiconductor substrate of the integrated circuit device 100 or an underlying interconnect of the integrated circuit device 100. For one embodiment, the diffusion barrier layer 115 is a titanium-containing layer. For a further embodiment, the diffusion barrier layer 115 is a titanium nitride layer.

An agglomeration control layer 120 is formed on the diffusion barrier layer 115 as a metal layer or a nitrided metal layer. For one embodiment, the agglomeration control layer 120 contains an early transition metal alloy of the form $MT_x$, where M is a first metal component, T is a Group IIIA or Group IVA transition metal and x is the atomic fraction of T. These early transition metal alloys contain a first metal component, M, that will be found in a subsequently-formed metal layer. For example, where copper (Cu) will be used as the major component of the interconnect structure, the first metal component of the agglomeration control layer 120 is chosen to be copper. Additional examples for the first metal component include noble and near noble metals such as silver (Ag), gold (Au), palladium (Pd), platinum (Pt), rhenium (Rh), iridium (Ir), ruthenium (Ru) and osmium (Os). Preferred metals for the interconnects and contacts typically have a high surface energy, which leads to difficulties in forming continuous layers due to a tendency to agglomerate during or after deposition.

The early transition metal alloys further contain a second metal component having a low surface energy relative to the metals used for the interconnects and contacts. The second metal component is a Group IIIA or Group IVA element as designated by the traditional IUPAC version of the periodic table. Such Group IIIA elements include scandium (Sc), yttrium (Y) and lanthanum (La). Such Group IVA elements include titanium (Ti), zirconium (Zr) and hafnium (Hf). Note that other versions of the periodic table are known using different designations for these same groups. The second metal component is capable of forming stable crystalline compounds with the first metal component. The early transition metals of Group IIIA and Group IVA have low surface energies, thus permitting improved adhesion to the underlying diffusion barrier layer 115.

The agglomeration control layer 120 is rich in the first metal component, i.e., the atomic ratio of the first metal component to the second metal component is greater than one. For better adhesion to the subsequent metal layer, the atomic ratio of the first metal component to the second metal component in the agglomeration control layer 120 is preferably greater than two.

Figure 2:
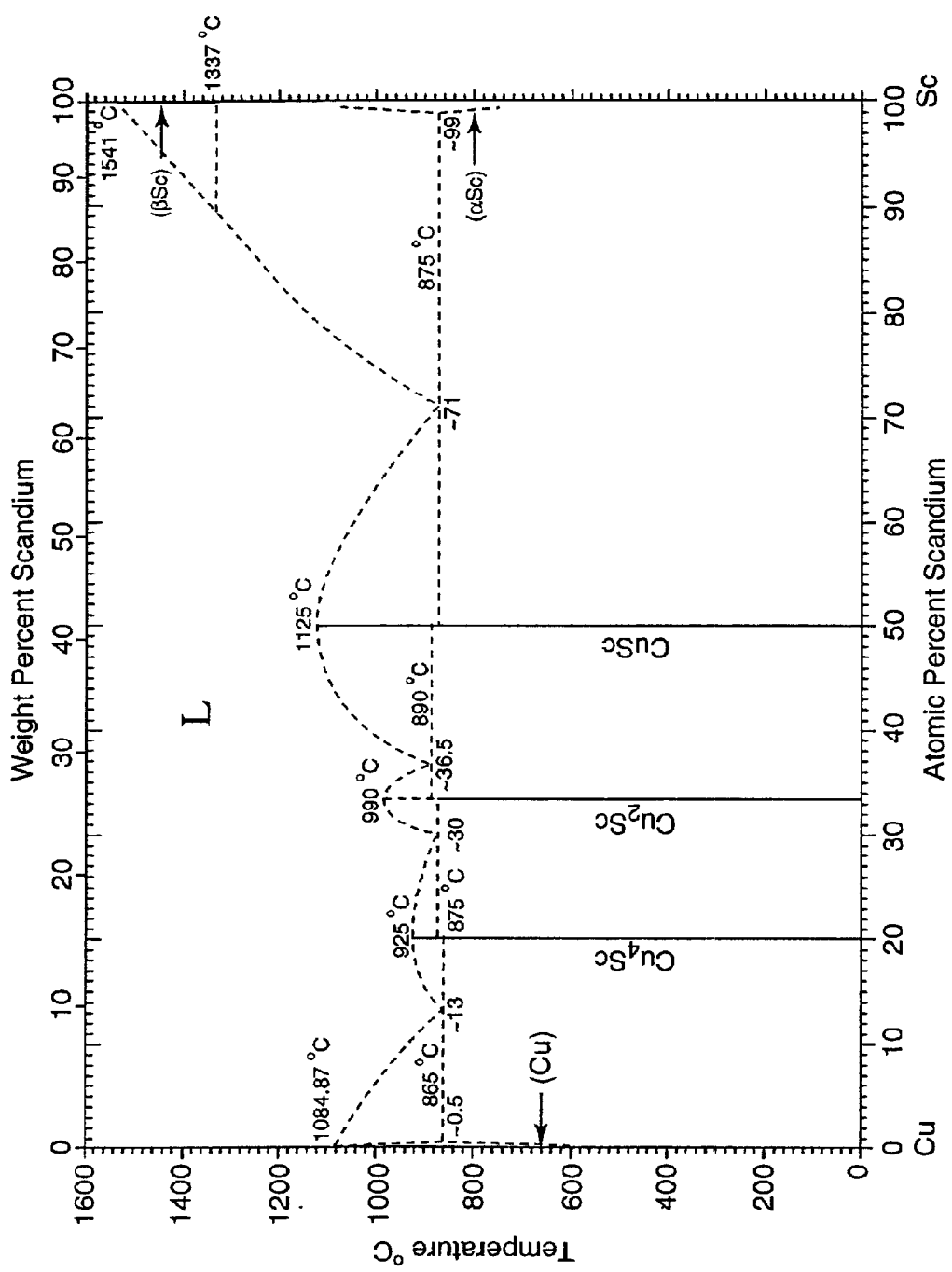
FIG. 2 is a binary phase diagram for a copper-scandium binary system.

For one class of embodiments using copper for the interconnects and contacts, the early transition metal alloys are copper-rich alloys containing copper and at least one Group IIIA or Group IVA element capable of forming a stable crystalline compound with copper. Such stable crystalline compounds can be readily determined from binary alloy phase diagrams of the two compounds of interest. For example, FIG. 2 is a binary phase diagram for the copper-scandium binary system as reported in *Binary Alloy Phase Diagrams: Second Edition*, Massalski, T. B., editor, The Materials Information Society, 1990. From FIG. 2, it can be seen that stable crystalline structures or equilibrium phases are found as Cu, $Cu_4Sc$, $Cu_2Sc$, CuSc, αSc and βSc. From these stable crystalline structures, $Cu_4Sc$ and $Cu_2Sc$ are copper-rich alloys and thus suitable for use with various embodiments. For alloys of other binary systems, appropriate binary alloy phase diagrams can be obtained or generated in order to identify stable crystalline structures.

For one embodiment, the agglomeration control layer 120 is a copper-rich alloy containing $Cu_4Sc$. For another embodiment, the agglomeration control layer 120 is a copper-rich alloy containing $Cu_6Y$. For yet another embodiment, the agglomeration control layer 120 is a copper-rich alloy containing $Cu_4Ti$. For still another embodiment, the agglomeration control layer 120 is a copper-rich alloy containing $Cu_3Ti$. For a further embodiment, the agglomeration control layer 120 is a copper-rich alloy containing $Cu_5Zr$.

For another class of embodiments using silver for the interconnects and contacts, the early transition metal alloys are silver-rich alloys containing silver and at least one Group IIIA element capable of forming a stable crystalline compound with silver. For one embodiment, the agglomeration control layer 120 is a silver-rich alloy containing $Ag_4Sc$. For another embodiment, the agglomeration control layer 120 is a silver-rich alloy containing $Ag_4Y$.

The crystalline alloy portions of the agglomeration control layer 120 generally provide reduced surface energies relative to amorphous films of the same metal components. This leads to improved adhesion between the agglomeration control layer 120 and the underlying diffusion barrier layer 115. Because crystalline alloy structures are more stable than amorphous alloys, crystalline alloys are also easier to fabricate with high levels of repeatability relative to amorphous alloys of the same metal components. Ease of fabrication and repeatability are important factors in reducing the cost of the integrated circuit device and in increasing its reliability.

Another consideration in the fabrication of the agglomeration control layer 120 is its electrical resistance. In general, higher levels of the first metal component will lead to lower resistance levels of the agglomeration control layer 120 and improved device performance. While crystalline alloy portions of the agglomeration control layer 120 provide improved adhesion to the underlying diffusion barrier layer 115, it is not necessary that the agglomeration control layer consist solely of crystalline structures of the first and second metal components. Regions of crystalline alloy structures can serve as nuclei for the growth of regions containing the first metal component in a substantially pure or elemental state. These regions of crystalline alloy structures provide the desired adhesion between the first metal component and the diffusion barrier layer 115. Thus, for additional embodiments, the agglomeration control layer 120 contains an amount of the first metal component in its elemental state. For one embodiment, at least 25 wt % of the agglomeration control layer 120 is the first metal component in its elemental state. For another embodiment, at least 50 wt % of the agglomeration control layer 120 is the first metal component in its elemental state. For a further embodiment, the atomic ratio of the first metal component to the second metal component is greater than 10. For a still further embodiment, the atomic ratio of the first metal component to the second metal component is greater than 20.

The agglomeration control layer 120 is preferably formed by physical vapor deposition (PVD) techniques. Examples include thermal evaporation, electron-beam evaporation and sputtering techniques well known in the art. PVD techniques are preferred as the crystalline structure is easily maintained during formation of the agglomeration control layer. A target, ingot or other source containing the crystalline alloy compound can be molded, pressed or otherwise formed for use in the chosen PVD technique.

For embodiments having an atomic ratio of the first metal component to the second metal component higher than the atomic ratio in the crystalline alloy compound, the PVD source may be a composite source containing a first portion of the crystalline alloy compound and a second portion of a material having increased levels of the first metal component, preferably other stable crystalline structures of the binary system and more preferably the first metal component in its elemental state. The first and second portions of the composite source are preferably intermixed to more easily form an agglomeration control layer 120 having a uniform composition. For example, a PVD source could be pressed from powdered $Cu_4Sc$ and pure copper to produce a composite source having an atomic ratio of copper to scandium of greater than four to one.

The composite source may further contain more than two metal components. For example, the composite source may contain a first metal component in its elemental state, a first crystalline alloy compound of the first metal component and a Group IIIA or Group IVA element, and a second crystalline alloy compound of the first metal component and a different Group IIIA or Group IVA element. PVD sources may further contain additional components that do not materially affect the basic and novel properties of the agglomeration control layers disclosed herein.

For one embodiment, the agglomeration control layer 120 contains an early transition metal alloy nitride. Metal alloy nitrides containing the first and second metal components are generally more robust at higher temperatures than their corresponding metal alloy. To produce a metal alloy nitride, the PVD process can be carried out in an atmosphere containing nitrogen ($N_2$). For example, the agglomeration control layer 120 can be formed by a reactive sputtering process using a target containing a crystalline alloy compound rich in the first metal component. During the reactive sputtering process, a nitrogen-containing atmosphere is created in the deposition chamber. The nitrogen-containing atmosphere preferably contains nitrogen and a noble or inert gas, e.g., argon (Ar). The nitrogen reacts with the first and second metal components in the target during deposition to form a metal alloy nitride of the form $MT_xN_y$, where M is the first metal component, T is a Group IIIA or Group IVA transition metal of the second metal component, N is nitrogen, x is the atomic fraction of T and y is the atomic fraction of N. For a further embodiment, the nitrogen-containing atmosphere contains approximately 5% to 30% nitrogen by volume.

Figure 1D:
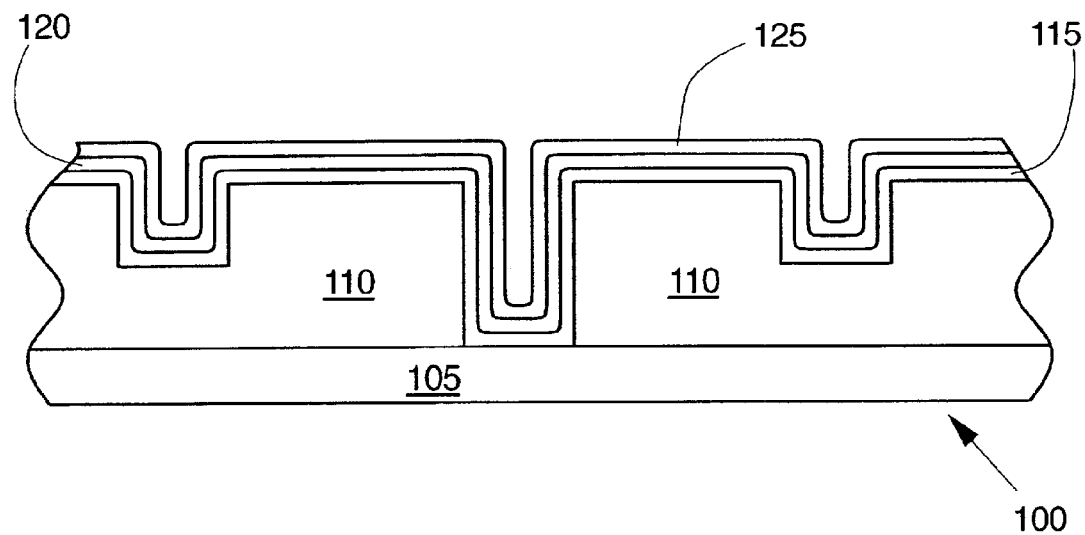
Figure 1E:
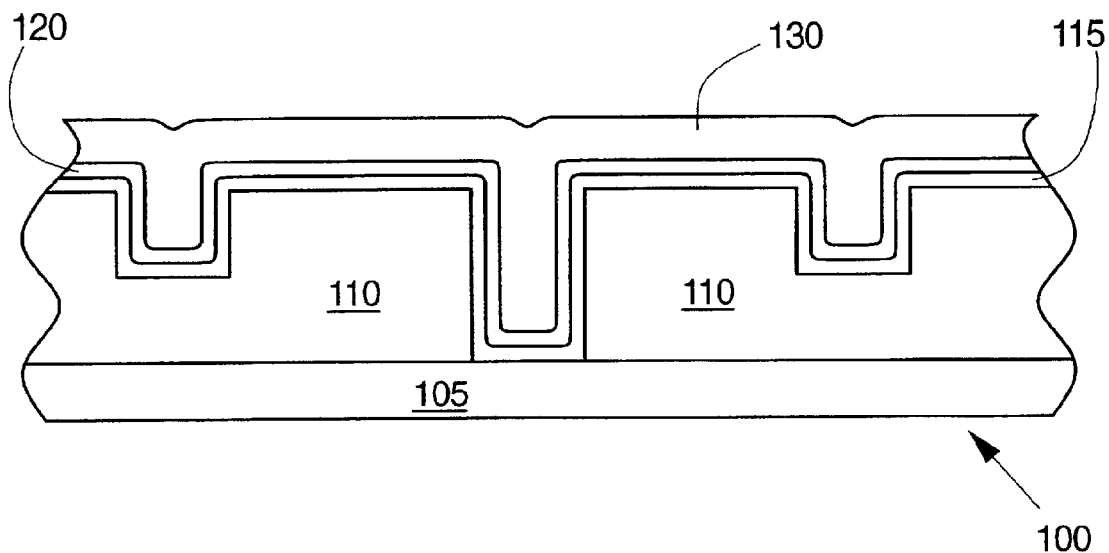

Following formation of the agglomeration control layer 120, a metal layer 130 is formed. The metal layer 130 is generally formed as a blanket deposition in dual damascene techniques. This fills the trenches 112 and vias 114 by covering the entire surface of the dielectric layer 110 with the metal layer 130. The metal layer 130 may be formed using chemical vapor deposition (CVD) or physical vapor deposition (PVD) techniques. Additionally, the metal layer 130 may be formed using electroplating techniques, which may include first forming an optional seed layer 125 overlying the agglomeration control layer 120, as shown in FIG. 1D, followed by electroplating the remaining portion of the metal layer 130 onto the seed layer 125 resulting in the structure shown in FIG. 1E. The seed layer 125 contains the first metal component. For one embodiment, the seed layer 125 consists essentially of the first metal component.

Electroless plating is another example of a process that may be used to form the metal layer 130 covering the surface of the integrated circuit device 100. The metal layer 130 contains the first metal component of the agglomeration control layer 120. For example, where the first metal component of the agglomeration control layer 120 contains copper, silver, gold, palladium, platinum, rhenium, iridium, ruthenium or osmium, the metal layer 130 contains copper, silver, gold, palladium, platinum, rhenium, iridium, ruthenium or osmium, respectively. The metal layer 130 is preferably not a composite material. For one embodiment, the metal layer 130 consists essentially of the first metal component.

Figure 1F:
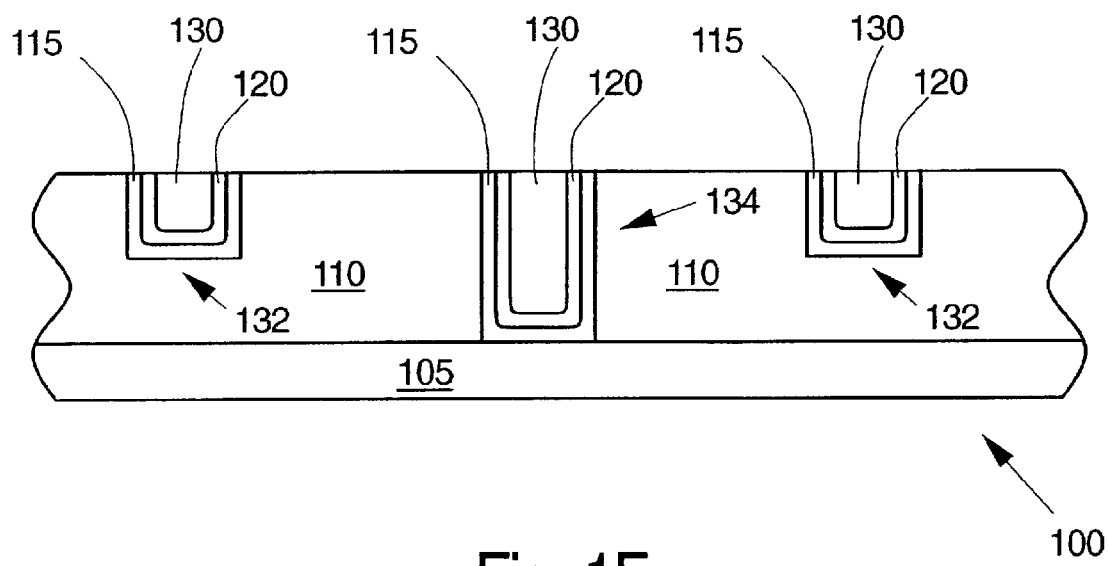

As the dual damascene approach uses a contiguous metal layer 130 to fill the trenches 112 and vias 114, excess portions of the metal layer 130 must generally be removed from the surface of the dielectric layer 110. Removal of the excess portions of the metal layer 130, along with excess portions of the agglomeration control layer 120 and the diffusion barrier layer 115, generally involves some mechanical action, such as chemical-mechanical planarization (CMP). CMP is sometimes also referred to as chemical-mechanical polishing. Removal of the excess portions of the metal layer 130 defines interconnect lines 132 and contacts 134 as shown in FIG. 1F.

The foregoing figures were used to aid the understanding of the accompanying text. However, the figures are not drawn to scale and relative sizing of individual features and layers are not necessarily indicative of the relative dimensions of such individual features or layers in application. Accordingly, the drawings are not to be used for dimensional characterization.

CONCLUSION

Structures and methods of fabricating portions of integrated circuit devices have been described to reduce agglomeration tendencies of high surface-energy metals used in interconnects and contacts. Early transition metals having relatively low surface energies are chosen to form stable crystalline compounds rich in the high surface-energy metal. Agglomeration control layers containing such alloy compounds facilitate adhesion between the high surface-energy metal and an underlying layer of the integrated circuit device, such as a diffusion barrier layer. These agglomeration control layers may be nitrided to improve robustness at higher temperatures.

Copper-rich or silver-rich agglomeration control layers described herein are especially beneficial in copper or silver damascene structures, respectively, as they facilitate the use of a titanium nitride diffusion barrier layer. Use of a titanium nitride diffusion barrier layer in copper or silver damascene structures permits use of a single slurry in a chemical-mechanical planarization process to remove the excess copper or silver as well as the excess diffusion barrier layer.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of forming a metal interconnect in an integrated circuit device, the method comprising:
    forming a diffusion barrier layer on a base layer;
    forming a layer of a metal alloy nitride on the diffusion barrier layer, wherein the metal alloy nitride comprises a first metal component, a second metal component which can form a crystalline compound with the first metal component, and nitrogen, wherein the second metal component has a surface energy lower than a surface energy of the first metal component, and wherein the metal alloy nitride is rich in the first metal component;
    forming a second metal layer on the layer of metal alloy nitride, wherein the second metal layer comprises the first metal component; and
    removing excess portions of the second metal layer to define the metal interconnect.

2. The method of claim 1, wherein forming a layer of a metal alloy nitride further comprises performing a physical vapor deposition process in a nitrogen-containing atmosphere using a physical vapor deposition source containing the first and second metal components.

3. The method of claim 2, wherein the physical vapor deposition source is a composite source having a first portion containing the first metal component in an elemental state and a second portion containing the crystalline compound of the first and second metal components.

4. The method of claim 3, wherein the first and second portions of the physical vapor deposition source are intermixed.

5. The method of claim 1, wherein forming a layer of a metal alloy nitride further comprises sputtering a composite target in a nitrogen-containing atmosphere, wherein the composite target has a first portion containing the first metal component in an elemental state and a second portion containing the crystalline compound of the first and second metal components, and wherein the nitrogen-containing atmosphere comprises approximately 5% to 30% by volume of nitrogen in an inert gas.

6. The method of claim 5, wherein the inert gas is argon.

7. The method of claim 1, wherein the diffusion barrier layer is a titanium-containing layer.

8. The method of claim 1, wherein the diffusion barrier layer is titanium nitride.

9. The method of claim 1, wherein the first metal component is selected from the group consisting of copper, silver, gold, palladium, platinum, rhenium, iridium, ruthenium and osmium.

10. The method of claim 1, wherein the second metal component is selected from the group consisting of scandium, yttrium, lanthanum, titanium, zirconium and hafnium.

11. The method of claim 1, wherein forming a second metal layer on the layer of metal alloy nitride further comprises forming a seed layer on the layer of metal alloy nitride and forming a metal layer on the seed layer, and wherein the seed layer and the metal layer each contain the first metal component.

12. The method of claim 1, wherein the base layer is selected from the group consisting of a semiconductor substrate and a conductor layer.

13. A method of forming a metal interconnect in an integrated circuit device, the method comprising:
    forming a diffusion barrier layer on a base layer;
    forming a nitrided metal layer on the diffusion barrier layer, wherein the nitrided metal layer comprises a first metal component, a second metal component capable of forming a crystalline compound with the first metal component, and nitrogen, wherein the second metal component has a surface energy lower than a surface energy of the first metal component, and wherein the nitrided metal layer is rich in the first metal component;
    forming a second metal layer on the nitrided metal layer, wherein the second metal layer comprises the first metal component; and
    removing excess portions of the second metal layer to define the metal interconnect;
    wherein forming a nitrided metal layer further comprises sputtering a composite target in a nitrogen-containing atmosphere, wherein the composite target has a first portion containing the first metal component in an elemental state and a second portion containing the crystalline compound of the first and second metal components, and wherein the nitrogen-containing atmosphere comprises approximately 5% to 30% by volume of nitrogen in an inert gas; and
    wherein the first and second portions of the composite target are intermixed.

14. The method of claim 11, wherein the seed layer consists essentially of the first metal component.

15. A method of forming a metal interconnect in an integrated circuit device, the method comprising:
    forming a dielectric layer on a base layer;
    forming a recess in the dielectric layer;
    forming a diffusion barrier layer on sidewalls of the recess and a surface of the base layer;
    forming a nitrided metal layer on the diffusion barrier layer, wherein the nitrided metal layer comprises a first metal component, a second metal component capable of forming a crystalline compound with the first metal component, and nitrogen, wherein the second metal component has a surface energy lower than a surface energy of the first metal component, and wherein the nitrided metal layer is rich in the first metal component;
    forming a metal layer on the nitrided metal layer, wherein the metal layer comprises the first metal component and wherein the metal layer fills the recess and overlies a surface of the dielectric layer; and
    removing portions of the diffusion barrier layer, the nitrided metal layer and the metal layer overlying the surface of the dielectric layer to define the metal interconnect as portions of the diffusion barrier layer, the nitrided metal layer and the metal layer remaining in the recess.

16. A method of forming a portion of an integrated circuit device, the method comprising:

forming a layer of titanium nitride;

forming a nitrided metal layer on the layer of titanium nitride, wherein the nitrided metal layer comprises a nitride metal alloy compound containing a first metal component, a second metal component and nitrogen, wherein the second metal component is selected from the group consisting of Group IIIA and Group IVA elements, and wherein an atomic ratio of the first metal component to the second metal component in the nitrided metal layer is greater than one; and forming a metal layer on the nitrided metal layer, wherein the metal layer comprises the first metal component.

17. The method of claim 16, wherein the atomic ratio of the first metal component to the second metal component in the first metal layer is greater than two.

18. The method of claim 16, wherein the atomic ratio of the first metal component to the second metal component in the first metal layer is greater than ten.

19. The method of claim 16, wherein the atomic ratio of the first metal component to the second metal component in the first metal layer is greater than twenty.

20. A method of forming a metal interconnect in an integrated circuit device, the method comprising:

forming a dielectric layer on a base layer;

forming a recess in the dielectric layer;

forming a titanium nitride layer on sidewalls of the recess and a surface of the base layer;

forming a nitrided metal layer on the titanium nitride layer, wherein the nitrided metal layer comprises copper, a metal component capable of forming a crystalline compound with the copper, and nitrogen, wherein the metal component is selected from the group consisting of scandium, yttrium, lanthanum, titanium, zirconium and hafnium, and wherein an atomic ratio of copper to the metal component in the nitrided metal layer is greater than one;

forming a copper layer on the nitrided metal layer, wherein the copper layer fills the recess and overlies a surface of the dielectric layer; and removing portions of the titanium nitride layer, the nitrided metal layer and the copper layer overlying the surface of the dielectric layer to define the metal interconnect as portions of the titanium nitride layer, the nitrided metal layer and the copper layer remaining in the recess.

21. A method of forming a portion of an integrated circuit device, the method comprising:

forming a layer of titanium nitride;

forming a nitrided metal layer on the layer of titanium nitride, wherein the nitrided metal layer is of the form $MT_xN_y$, where M is a first metal component, T is a Group IIIA or Group IVA transition metal, N is nitrogen, x is an atomic fraction of T, y is an atomic fraction of N, and x and y are each less than one; and forming a metal layer on the nitrided metal layer, wherein the metal layer comprises the first metal component.

22. The method of claim 21, wherein forming a layer of titanium nitride further comprises forming a layer of titanium nitride covering sidewalls and a bottom of a recess.

23. The method of claim 22, wherein a portion of the layer of titanium nitride covering the bottom of the recess is in contact with a base layer underlying a dielectric layer.

24. The method of claim 23, wherein the base layer is selected from the group consisting of a semiconductor substrate and a conductor layer.

25. The method of claim 21, wherein M is selected from the group consisting of copper, silver, gold, palladium, platinum, rhenium, iridium, ruthenium and osmium.

26. The method of claim 21, wherein T is selected from the group consisting of scandium, yttrium, lanthanum, titanium, zirconium and hafnium.

27. A method of forming a portion of an integrated circuit device, the method comprising:

forming a layer of titanium nitride;

forming a nitrided metal layer on the layer of titanium nitride, wherein the nitrided metal layer is of the form $MT_xN_y$, where M is a first metal component, T is a Group IIIA or Group IVA transition metal, N is nitrogen, x is an atomic fraction of T, y is an atomic fraction of N, x is less than approximately 0.1 and y is less than approximately 0.9; and forming a metal layer on the nitrided metal layer, wherein the metal layer comprises the first metal component.

28. The method of claim 27, wherein x is less than approximately 0.05.

29. A method of forming a portion of an integrated circuit device, the method comprising:

forming a layer of titanium nitride;

forming a nitrided metal layer on the layer of titanium nitride, wherein the nitrided metal layer is of the form $CuT_xN_y$, where Cu is copper, T is a Group IIIA or Group IVA transition metal, N is nitrogen, x is an atomic fraction of T, y is an atomic fraction of N, and x and y are each less than one; and forming a metal layer on the nitrided metal layer, wherein the metal layer comprises copper.

30. The method of claim 29, wherein T is selected from the group consisting of scandium, yttrium, lanthanum, titanium, zirconium and hafnium.

31. A method of forming a portion of an integrated circuit device, the method comprising:

forming a layer of titanium nitride;

forming a nitrided metal layer on the layer of titanium nitride, wherein the nitrided metal layer is of the form $CuT_xN_y$, where Cu is copper, T is a Group IIIA or Group IVA transition metal, N is nitrogen, x is an atomic fraction of T, y is an atomic fraction of N, x is less than approximately 0.1 and y is less than approximately 0.9; and forming a copper layer on the nitrided metal layer.

32. A method of forming a portion of an integrated circuit device, the method comprising:

forming a layer of titanium nitride;

forming a nitrided metal layer on the layer of titanium nitride, wherein the nitrided metal layer comprises copper, a metal component selected from the group consisting of scandium, yttrium, lanthanum, titanium, zirconium and hafnium, and nitrogen, wherein an atomic ratio of copper to the metal component in the nitrided metal layer is greater than ten; and forming a copper layer on the nitrided metal layer.

33. The method of claim 32, wherein the atomic ratio of copper to the metal component in the nitrided metal layer is greater than twenty.

34. A method of forming a metal interconnect in an integrated circuit device, the method comprising:
  forming a dielectric layer on a base layer;
  forming a recess in the dielectric layer;
  forming a titanium nitride layer on sidewalls of the recess and a surface of the base layer;
  forming a nitrided metal layer on the titanium nitride layer, wherein the nitrided metal layer comprises silver, a metal component capable of forming a crystalline compound with the silver, and nitrogen, wherein the metal component is selected from the group consisting of scandium, yttrium and lanthanum, and wherein an atomic ratio of silver to the metal component in the nitrided metal layer is greater than one;
  forming a silver layer on the nitrided metal layer, wherein the silver layer fills the recess and overlies a surface of the dielectric layer; and
  removing portions of the titanium nitride layer, the nitrided metal layer and the silver layer overlying the surface of the dielectric layer to define the metal interconnect as portions of the titanium nitride layer, the nitrided metal layer and the silver layer remaining in the recess.

35. A method of forming a portion of an integrated circuit device, the method comprising:
  forming a layer of titanium nitride;
  forming a nitrided metal layer on the layer of titanium nitride, wherein the nitrided metal layer is of the form $AgT_xN_y$, where Ag is silver, T is a Group IIIA transition metal, N is nitrogen, x is an atomic fraction of T, y is an atomic fraction of N, and x and y are each less than one; and
  forming a metal layer on the nitrided metal layer, wherein the metal layer comprises silver.

36. The method of claim 35, wherein T is selected from the group consisting of scandium, yttrium, and lanthanum.

37. A method of forming a portion of an integrated circuit device, the method comprising:
  forming a layer of titanium nitride;
  forming a nitrided metal layer on the layer of titanium nitride, wherein the nitrided metal layer is of the form $AgT_xN_y$, where is silver, T is a Group IIIA transition metal, N is nitrogen, x is an atomic fraction of T, y is an atomic fraction of N, x is less than approximately 0.1 and y is less than approximately 0.9; and
  forming a silver layer on the nitrided metal layer.

38. The method of claim 37, wherein x is less than approximately 0.05.

39. A method of forming a portion of an integrated circuit device, the method comprising:
  forming a layer of titanium nitride;
  forming a nitrided metal layer on the layer of titanium nitride, wherein the nitrided metal layer comprises silver, a metal component selected from the group consisting of scandium, yttrium and lanthanum, and nitrogen, wherein an atomic ratio of silver to the metal component in the nitrided metal layer is greater than ten; and
  forming a silver layer on the nitrided metal layer.

40. The method of claim 39, wherein the atomic ratio of silver to the metal component in the nitrided metal layer is greater than twenty.

41. A method of forming a metal interconnect in an integrated circuit device, the method comprising:
  forming a dielectric layer on a base layer;
  forming a recess in the dielectric layer;
  forming a titanium nitride layer on sidewalls of the recess and a surface of the base layer;
  forming a nitrided metal layer on the titanium nitride layer using a physical vapor deposition process in a nitrogen-containing atmosphere and a physical vapor deposition source containing copper and a metal component capable of forming a crystalline compound with copper, wherein the metal component is selected from the group consisting of scandium, yttrium, lanthanum, titanium, zirconium and hafnium, and wherein an atomic ratio of copper to the metal component in the nitrided metal layer is greater than one;
  forming a copper layer on the nitrided metal layer, wherein the copper layer fills the recess and overlies a surface of the dielectric layer; and
  removing portions of the titanium nitride layer, the nitrided metal layer and the copper layer overlying the surface of the dielectric layer to define the metal interconnect as portions of the titanium nitride layer, the nitrided metal layer and the copper layer remaining in the recess.

42. The method of claim 41, wherein the physical vapor deposition source is a composite source having a first portion containing copper in an elemental state and a second portion containing the crystalline compound of copper and the metal component.

43. The method of claim 42, wherein the crystalline compound is copper-rich.

44. The method of claim 42, wherein the first and second portions of the physical vapor deposition source are intermixed.

45. The method of claim 41, wherein the physical vapor deposition process is a sputtering process.

46. The method of claim 41, wherein the nitrogen-containing atmosphere comprises approximately 5% to 30% by volume of nitrogen in an inert gas.

47. The method of claim 44, wherein the inert gas is argon.

48. A method of forming a metal interconnect in an integrated circuit device, the method comprising:
  forming a dielectric layer on a base layer;
  forming a recess in the dielectric layer;
  forming a titanium nitride layer on sidewalls of the recess and a surface of the base layer;
  forming a nitrided metal layer on the titanium nitride layer using a physical vapor deposition process in a nitrogen-containing atmosphere and a physical vapor deposition source containing silver and a metal component capable of forming a crystalline compound with silver, wherein the metal component is selected from the group consisting of scandium, yttrium and lanthanum, and wherein an atomic ratio of silver to the metal component in the nitrided metal layer is greater than one;
  forming a silver layer on the nitrided metal layer, wherein the silver layer fills the recess and overlies a surface of the dielectric layer; and
  removing portions of the titanium nitride layer, the nitrided metal layer and the silver layer overlying the surface of the dielectric layer to define the metal interconnect as portions of the titanium nitride layer, the nitrided metal layer and the silver layer remaining in the recess.

49. The method of claim 48, wherein the physical vapor deposition source is a composite source having a first portion containing silver in an elemental state and a second portion containing the crystalline compound of silver and the metal component.

50. The method of claim 49, wherein the crystalline compound is silver-rich.

51. The method of claim 49, wherein the first and second portions of the physical vapor deposition source are intermixed.

52. The method of claim 48, wherein the physical vapor deposition process is a sputtering process.

53. The method of claim 48, wherein the nitrogen-containing atmosphere comprises approximately 5% to 30% by volume of nitrogen in an inert gas.

54. The method of claim 51, wherein the inert gas is argon.

55. A method of forming a metal interconnect in an integrated circuit device, the method comprising:

forming a titanium nitride layer on a base layer;

forming a nitrided metal layer on the titanium nitride layer, wherein the nitrided metal layer comprises a first metal component, a second metal component capable of forming a crystalline compound with the first metal component, and nitrogen, wherein the second metal component has a surface energy lower than a surface energy of the first metal component, and wherein the nitrided metal layer is rich in the first metal component;

forming a second metal layer on the nitrided metal layer, wherein the second metal layer comprises the first metal component; and removing excess portions of the second metal layer to define the metal interconnect;

wherein the first metal component is selected from the group consisting of copper, silver, gold, palladium, platinum, rhenium, iridium, ruthenium and osmium; and wherein the second metal component is selected from the group consisting of scandium, yttrium, lanthanum, titanium, zirconium and hafnium.

56. The method of claim 55, wherein forming a nitrided metal layer further comprises performing a physical vapor deposition process in a nitrogen-containing atmosphere using a physical vapor deposition source containing the first and second metal components.

57. The method of claim 56, wherein the physical vapor deposition source is a composite source having a first portion containing the first metal component in an elemental state and a second portion containing the crystalline compound of the first and second metal components.

58. The method of claim 57, wherein the first and second portions of the physical vapor deposition source are intermixed.

59. The method of claim 55, wherein forming a nitrided metal layer further comprises sputtering a composite target in a nitrogen-containing atmosphere, wherein the composite target has a first portion containing the first metal component in an elemental state and a second portion containing the crystalline compound of the first and second metal components, and wherein the nitrogen-containing atmosphere comprises approximately 5% to 30% by volume of nitrogen in an inert gas.

60. The method of claim 59, wherein the first and second portions of the composite target are intermixed.

61. The method of claim 59, wherein the inert gas is argon.

62. The method of claim 55, wherein forming a second metal layer on the nitrided metal layer further comprises forming a seed layer on the nitrided metal layer and forming a metal layer on the seed layer, and wherein the seed layer and the metal layer each contain the first metal component.

63. The method of claim 62, wherein the seed layer consists essentially of the first metal component.

64. The method of claim 55, wherein the base layer is selected from the group consisting of a semiconductor substrate and a conductor layer.

* * * * *

UNITED STATES PATENT AND TRADEMARK OFFICE
CERTIFICATE OF CORRECTION

PATENT NO. : 6,900,119 B2
DATED : May 31, 2005
INVENTOR(S) : Yonjun Jeff Hu

It is certified that error appears in the above-identified patent and that said Letters Patent is hereby corrected as shown below:

Column 13,
Line 42, after "where" and before "is", insert -- Ag --.

Signed and Sealed this

Twenty-eighth Day of March, 2006

JON W. DUDAS
*Director of the United States Patent and Trademark Office*